(12) United States Patent
Konno

(10) Patent No.: US 6,415,419 B1
(45) Date of Patent: Jul. 2, 2002

(54) SEMICONDUCTOR INTEGRATED CIRCUIT DEVICE AND CIRCUIT DESIGNING METHOD THEREFOR

(75) Inventor: Mamoru Konno, Kanagawa (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/291,849

(22) Filed: Apr. 14, 1999

(30) Foreign Application Priority Data

Apr. 14, 1998 (JP) .......................................... 10-102418

(51) Int. Cl.[7] .............................................. G06F 17/50
(52) U.S. Cl. .................................. 716/4; 716/7; 716/14
(58) Field of Search .................................. 716/4, 7, 14

(56) References Cited

U.S. PATENT DOCUMENTS

| 4,656,592 A | * | 4/1987 | Spaanenburg et al. | .......... 716/7 |
| 4,823,276 A | * | 4/1989 | Hiwatashi | .................... 716/14 |
| 5,331,571 A | * | 7/1994 | Aronoff et al. | ................. 716/4 |
| 5,663,662 A | * | 9/1997 | Kurosawa | .................... 716/14 |

FOREIGN PATENT DOCUMENTS

| JP | 5-102308 | 4/1993 |
| JP | 5189332 | 7/1993 |
| JP | 6-109816 | 4/1994 |
| JP | 8102492 | 4/1996 |
| JP | 9274592 | 10/1997 |

OTHER PUBLICATIONS

Japanese Office Action issued Feb. 22, 2000 in a related application with English translation of relevant portions.

\* cited by examiner

*Primary Examiner*—Trong Phan
(74) *Attorney, Agent, or Firm*—Dickstein, Shapiro, Morin & Oshinsky, LLP.

(57) ABSTRACT

A semiconductor integrated circuit device includes a logic LSI formed on a semiconductor substrate and divided into a plurality of function blocks, each of which can receive a test data directly from an external and can output a test result directly to the external. The whole of the logic LSI is divided in accordance with the Rent rule into the plurality of function blocks which have a constant size and which are located in a predetermined locating manner. A test dedicated bus is laid out on the semiconductor substrate to pass through all the plurality of function blocks for transferring the test data and the test result of each function block.

12 Claims, 5 Drawing Sheets

SEMICONDUCTOR INTEGRATED CIRCUIT DEVICE AND CIRCUIT DESIGNING METHOD THEREFOR

BACKGROUND OF THE INVENTION

1. Field of the Invention

The present invention relates to a semiconductor integrated circuit device and a circuit designing method therefor, and more specifically to a semiconductor integrated circuit device such as an application specific integrated circuit (ASIC) internally including a circuit used at a testing time, and a circuit designing method therefor.

2. Description of Related Art

Recently, increase of the scale of the LSI (large scale integrated circuit) and complication of the internal functions are very remarkable. In addition, the speed-up of the processing and the increase in width of a data bus also become remarkable. Therefore, a test of an operation of the LSI has increased in importance. The increase of the functions incorporated in the LSI results in the increase of logic circuits incorporated in the LSI, and therefore, the circuits for testing these functions have inevitably increased. In general, the larger the circuit scale is, the required test time exponentially increases, and on the other hand, the precision of the test exponentially decreases.

Referring to FIG. 1, there is shown a layout diagram illustrating a first example of the prior art semiconductor integrated circuit device internally including the circuit used at the testing time. The prior art semiconductor integrated circuit device shown in FIG. 1 includes a plurality of function blocks 11 formed on a semiconductor substrate (chip) 100, and test dedicated input/output buses 13 also formed on the semiconductor substrate 100, each of the input/output buses 13 supplying an input signal from an external test circuit to a corresponding function block and transferring an output signal from the corresponding function block to the external test circuit.

A method for testing this first prior art semiconductor integrated circuit device is that a predetermined test pattern is supplied from the external test circuit to a selected test dedicated input/output bus 13 so as to be given to the function block 11 to be put under test. An output signal generated in the function block 11 under test in response to the given test pattern is outputted through the test dedicated input/output bus 13 to the external test circuit. It is then determined whether or not the value of the output signal is equal to an expected value which was previously prepared. by means of a simulation at a designing stage for the same test pattern.

On the other hand, a logic circuit which is not connected to the test dedicated input/output buses 13, is tested in such a manner that a predetermined test pattern is supplied to input terminals of the semiconductor integrated circuit device under test, and whether or not an expected value corresponding to the given test pattern appears on output terminals of the semiconductor integrated circuit device, is checked.

Now, a circuit designing method for the first prior art semiconductor integrated circuit device will be described with reference to FIG. 2 which is a flow chart for illustrating the steps of the circuit designing method. First, after a chip specification is determined a circuit of a desired function block is designed (step P1). Then a circuit used for testing, the desired function block is designed (step P4). Thereafter a test pattern for the desired function block is prepared (step S5). In parallel, a "chip for test" is prepared on the basis of the result of the circuit design of the desired function block and the result of the circuit design of the circuit used for the testing (step S6). Finally, the "chip for test" is tested using, the test pattern prepared (step S7). If the result of the test is successful, the design is completed.

In this first prior art semiconductor integrated circuit device, since the test is executed for each one logic or function block, if the integration degree of the function block is elevated, namely, if the number of gates is increased, it becomes difficult to check all gates internally included in each function block by means of the test patterns given to each function block. Therefore, with an increased integration decree of each function block, the lowering of the failure detection percentage and the increase of the test time become remarkable. In addition, since one independent test dedicated input/output bus are formed for each function block. the number of required terminals and the occupied area inevitably increase.

In order to improve the above mentioned prior art semiconductor integrated circuit device, Japanese Patent Application Pre-examination Publication No. JP-A-06-109816 (an English abstract of which is available and the content of the English abstract is incorporated by reference in its entirety into this application) proposes a second prior art semiconductor integrated circuit device which is so configured to cause a plurality of function blocks to share one test dedicated input/output bus. In a logic LSI such as a gate array, according to JP-A-06-109816, the circuit is divided into a plurality of function blocks, and an output of each function block is provided with a buffer circuit having a data latch function and a scan path function allowing a received signal to pass without modification. The buffer circuit is controlled by a control signal so as to assume a selected one of the data latch function and the scan path function, and each buffer circuit is connected to a common test dedicated bus so that a test data can be directly supplied to or received from the buffer circuit.

However, even in this second prior art semiconductor integrated circuit device, similarly to the first prior art semiconductor integrated circuit device, if the integration degree of the function block is elevated. it becomes difficult to check all gates internally included in each function block by means of the test patterns given to each function block. In addition, the lowering of the failure detection percentage and the increase of the test the become remarkable. On the other hand. JP-A-06-109816 does not mention how the test dedicated bus is laid out. Therefore, although the number of required terminals can be surely reduced by JP-A-06-109816, the degree of increase in the area occupied by the test function including the buffer circuits and the test dedicated bus is unknown.

Furthermore, there is a third prior art semiconductor integrated circuit device intended to elevate the failure detection percentage. This third prior art semiconductor integrated circuit device uses a cross-check testing method which uses conventional test patterns and which checks an output voltage of all cell arrays in each test pattern. With this arrangement, not only output pins of the chip and the function blocks but also the inside of the circuit are observed in detail in order to elevate the failure detection percentage.

In this third prior art semiconductor integrated circuit device, however, a problem is encountered in that the number of test patterns required for the cross-check greatly increases. Therefore, the design time and the test time remarkably increase.

SUMMARY OF THE INVENTION

Accordingly, it is an object of the present invention to provide a semiconductor integrated circuit device which has overcome the above mentioned problems of the prior art, and a circuit designing method therefor.

Another object of the present invention is to provide a semiconductor integrated circuit device capable of testing all functions and all circuit performance of all function blocks in the semiconductor integrated circuit device, without lowering the failure detection percentage and without increasing the test time, with a reduced number of input/output terminals and with a reduced area occupied for the test function, and a circuit designing, method therefor.

The above and other objects of the present invention are achieved in accordance with the present invention by a semiconductor integrated circuit device including a logic LSI formed on a semiconductor substrate and divided into a plurality of function blocks, each of which can receive a test data directly from an external and can output a test result directly to the external, wherein the whole of the logic LSI is divided in accordance with a predetermined dividing rule into the plurality of function blocks which have a constant size and which are located in a predetermined locating manner, and a test dedicated bus is laid out on the semiconductor substrate to pass through all the plurality of function blocks for transferring the test data and the test result of each function block.

According to another aspect of the present invention there is provided a circuit designing method for the semiconductor integrated circuit device, comprising:

a whole circuit designing step for performing a whole circuit resign, including a circuit design for the semiconductor integrated circuit device having a predetermined function and a circuit design for a test circuit for design the predetermined function;

a test dedicated bus width determining step for determining the number of lines of a test dedicated bus for transferring a test pattern and the result of a test;

a function block size determining step for determining a function block size which is a size of function blocks obtained by dividing the whole circuit in accordance with a predetermined dividing rule;

a circuit designing step for designing a circuit for each function block in consideration of the width of the test dedicated bus so that a whole circuit is constituted of a plurality of function blocks each having the determined function block size;

a test pattern preparing step for preparing the test pattern for each of the function blocks;

a semiconductor chip manufacturing step for fabricating a semiconductor chip on the basis of the design result in the circuit designing step; and a test step for testing the semiconductor chip thus fabricated, by using the test pattern prepared in the test pattern preparing step.

The above and other objects features and advantages of the present invention will be apparent from the following description of preferred embodiments of the invention with reference to the accompanying drawings.

DESCRIPTION OF THE PREFERRED EMBODIMENTS

Figure 1:
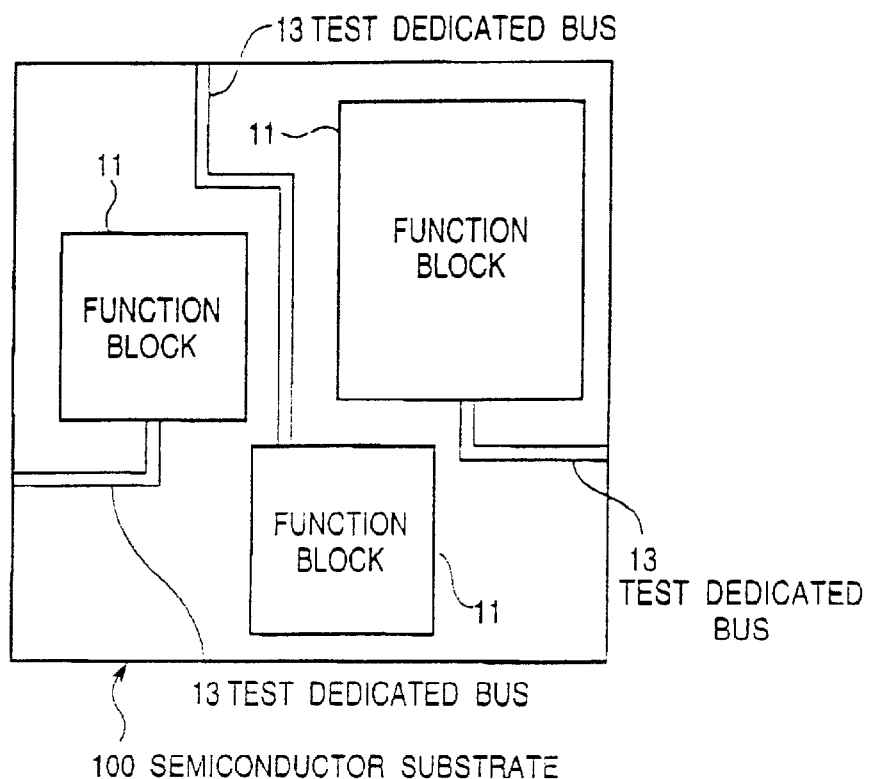
FIG. 1 is a layout diagram illustrating a first example of the prior art semiconductor integrated circuit device internally including the circuit used at the testing time.
Figure 2:
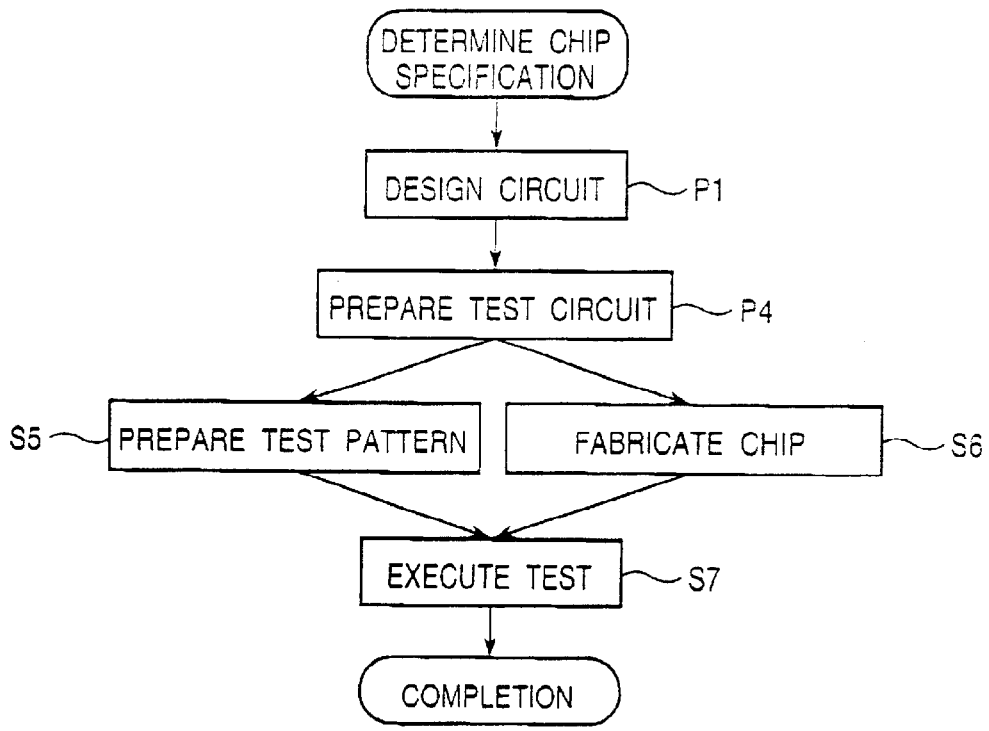
FIG. 2 is a flow chart for illustrating the steps of the circuit designing method in the prior art.
Figure 3:
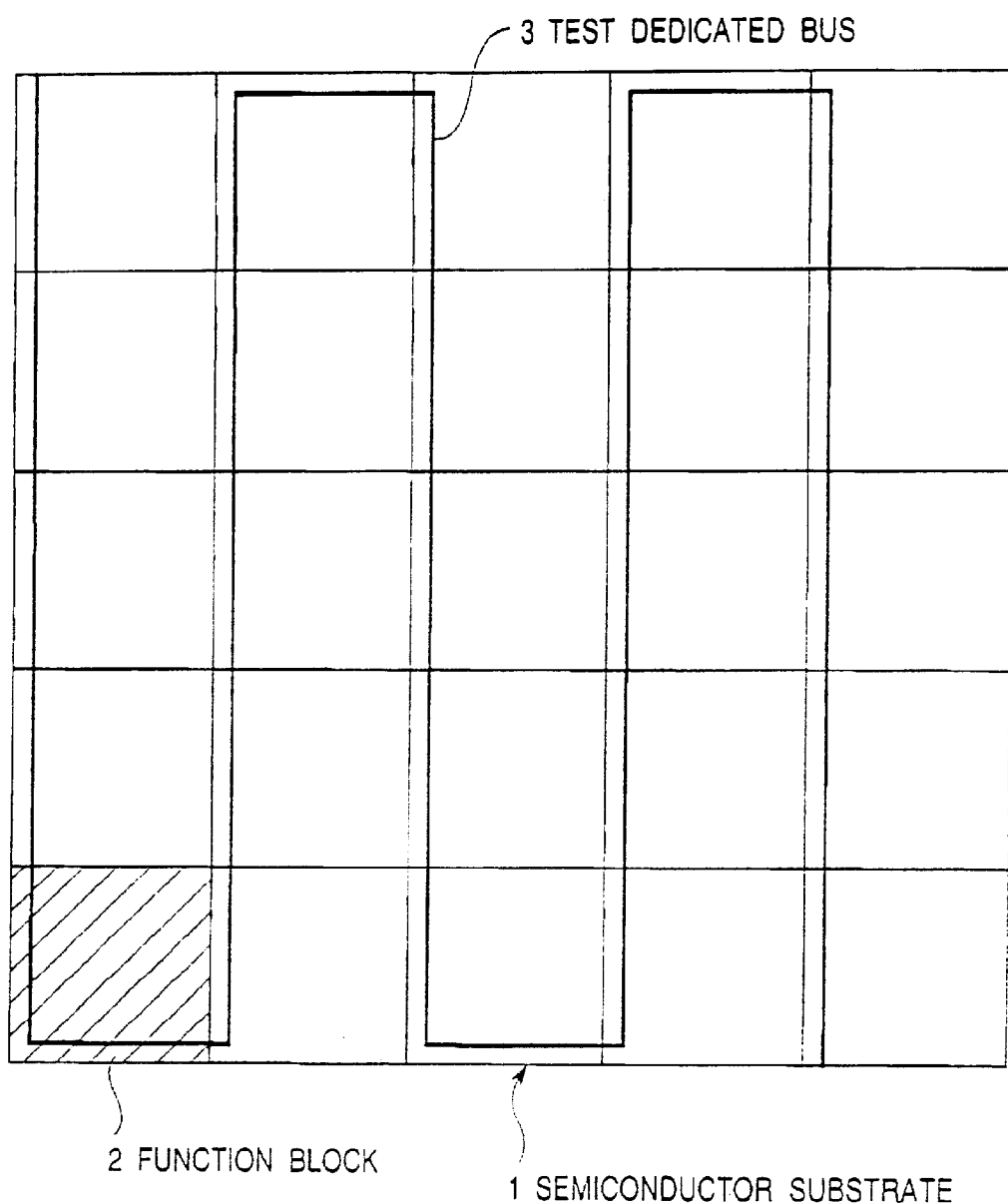
FIG. 3 is a layout diagram illustrating an embodiment of the semiconductor integrated circuit device in accordance with the present invention.

Referring to FIG. 3. there is shown a layout diagram illustrating an embodiment of the semiconductor integrated circuit device in accordance with the present invention.

The shown semiconductor integrated Circuit device includes a plurality of function block 2 which are obtained by dividing a semiconductor substrate (chip) 1 into regions having the same constant area and which are located in the form of a matrix, and a test dedicated bus 3 laid out on the semiconductor substrate 1 to pass through all the plurality of function blocks 2 for transferring the test data for each function block and the test result of each function block.

Here, the size of the function blocks 2, namely, the size of the divided regions, is directly determined from a relation among the width of the test dedicated bus 3, the integration degree which can be accessed through the test dedicated bus 3 for the testing, and the number of terminals (namely, the number of input/output pins) of each function block.

A main factor of the function blocks of the integrated circuit is the integration degree and the number of terminals (namely, the number of input/output pins). In general, the integration degree increases with increase of the function. In addition, the number of terminals is in proportion to the function, namely to the integration degree. Here the "integration degree" is represented by the number of function elements (or unitary functional circuits), or the number of gates converted into 3-input NOR (or NAND) gates, Here, the input number "3," is selected for convenience because it is in many cases that a major portion of a logic circuit is constituted of 2-input or 3-input gates.

In general, the in-block gate number "G" and the input/output pin number "P" per one block have the following relation which is called a Rent rule:

$$P = K \times G^\gamma$$

where K is a constant number which is in the range of 2.5 to 5.0, and $\gamma$ is also a constant number which is in the range of 0.4 to 0.7.

The size of the divided regions (namely, the function blocks) is determined by utilizing this equation.

In the ASIC of a MOS cell based IC under the current 0.35 $\mu$m rule, the number of grids being used in the maximum muster (step number) is 8,037,500. At average, since one gate is about 3.0 grids, the IC chip using this master includes about 2,700,000 pates.

Therefore, assuming that G=2,700,000, K=2.5, and $\gamma$=0.4, the input/output pin number "P" becomes about 685. The size which can be obtained by dividing this pin number of 685 and which can be located with no difficulty, is determined as the size of the divided regions, namely, the size of the function blocks.

Here, for convenience of description if a locatable pin number per one block is on the order of 25 to 30, and if the whole circuit is equally divided by 25, the pin number "P" per one block becomes 27.4. This value meets with this condition.

On the other hand, the test dedicated bus 3 is required to be located near to and to be connected to all function elements included in the semiconductor substrate 1 at such a degree as to be able to test all the function elements. Therefore, the test dedicated bus 3 is previously laid out on the semiconductor substrate 1 to meet with this condition. Alternatively, the test dedicated bus 3 is laid out, just as a single stroke painting, to pass through each of the function blocks 2 obtained by the above mentioned division manner, as shown in FIG. 3.

Thus, over the whole of the semiconductor integrated circuit device, the semiconductor substrate 1 is divided, the function blocks 2 are laid out, and the test dedicated bus 3 is laid out. As a result, in this embodiment of the semiconductor integrated circuit device, the function blocks 2 are laid out in the form of a matrix, and the test dedicated bus 3 is laid out just as a single stroke painting, to pass through each of the function blocks 2 laid out in the form of a matrix, as shown in FIG. 3.

Figure 4:
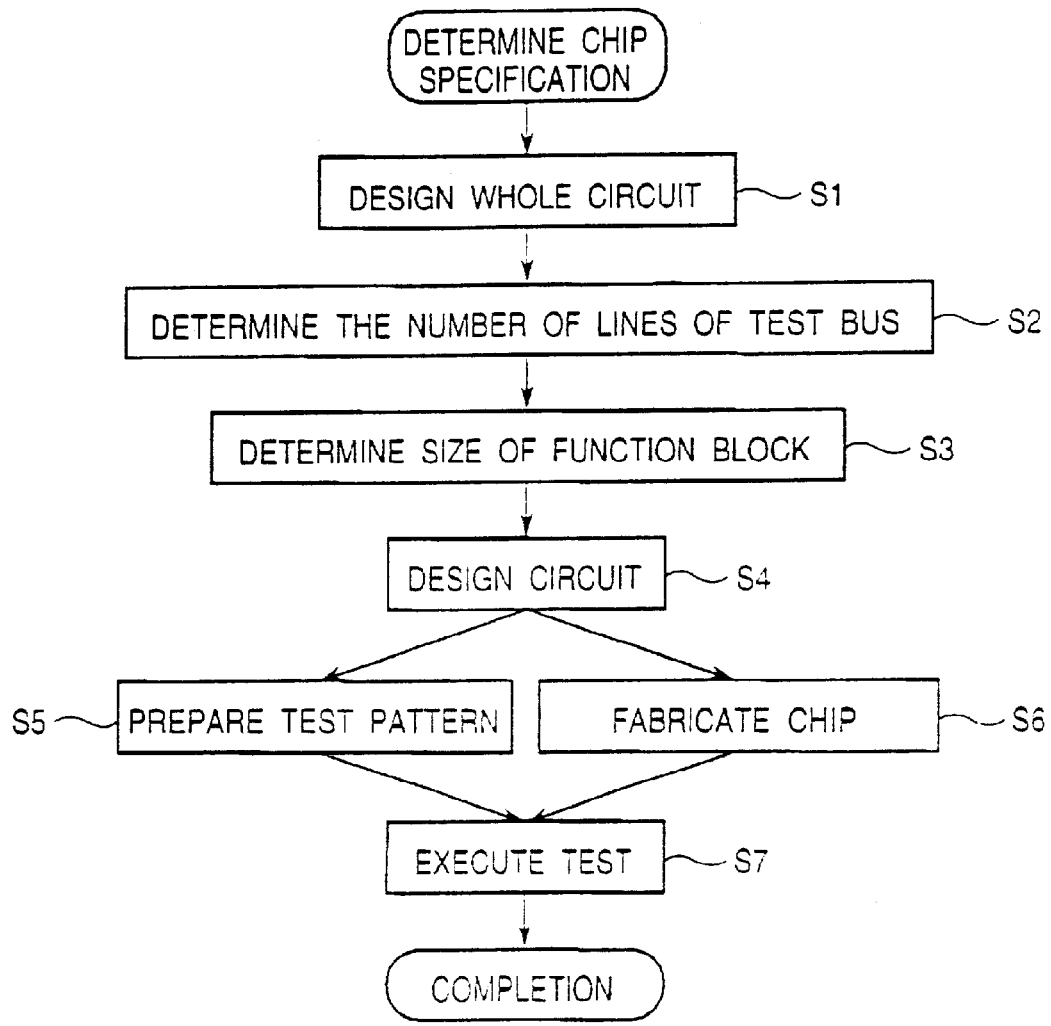
FIG. 4 is a flow chart for illustrating the steps of an embodiment of the circuit designing method in accordance with the present invention.

Next, the circuit designing method for the first embodiment of the semiconductor integated circuit device will be described with further reference to FIG. 4 which is a flow chart for illustrating the steps of an embodiment of the circuit designing method in accordance with the present invention.

First, after the specification of the IC chip is determined the whole circuit design is performed in a step S1. Therefore a circuit design for the semiconductor integrated circuit device having a predetermined total function is performed, and at the same time, a circuit design for a test circuit for testing the predetermined total function is also performed.

Then, the width (namely, the number of lines) of the test dedicated bus 3 for transferring a test pattern and the result of the testing is determined (step S2). At present the number of lines of the test dedicated bus 3 would be selected within the range of 4 to 32, depending upon a user's demand. In addition when the number of lines of the test dedicated bus 3 is determined, it is preferable to consider an estimated pin number of the function block.

After the width of the test dedicated bus 3 is determined, the size of the function block 2 is determined in accordance with the Rent rule mentioned hereinbefore (step S3).

Here, the semiconductor substrate 1 is geometrically divided, but it is not necessary to actually form a geometrical partition on the semiconductor substrate 1. It is sufficient if the semiconductor substrate 1 is divided into the plurality of function blocks laid out in the form of a matrix. In addition, it is not necessary to divide the semiconductor substrate 1 into sets each having the same function. Since the semiconductor substrate is divided into the function blocks 2 having the size which can be tested by way of the test dedicated bus 3 passing through all the function blocks it is possible to surely test each of the function blocks 3.

Thereafter, considering the width of the test dedicated bus 3, the circuit design is performed for each of a plurality of function blocks 2 so that the whole circuit is constituted of the plurality of function blocks each having the same function block size and located in the form of a matrix (step S4). At this time, a circuitry used for testing each function block is designed.

Furthermore, similarly to the prior art, a test pattern for testing each function block is prepared (step S5). In parallel, a semiconductor chip is fabricated on the basis of the result of the circuit design of the function blocks and the circuitry used for the testing (step S6). Finally, the semiconductor chip is tested by supplying each function block with a corresponding prepared test pattern (step S7). If the result of the test is successful, the design is completed.

Here, since the circuitry used for testing the function block and the method for testing the function block by way of the circuitry are well known to persons skilled in the art, explanation will be omitted.

Next, a method for controlling the test dedicated bus 3 for the purpose of testing each of the function blocks 2 will be described with reference to FIG. 5 which is a layout diagram illustrating a detail of two function blocks 2, the test dedicated bus 3 and their peripheral circuit, in the embodiment of the semiconductor integrated circuit device in accordance with the present invention.

Figure 5:
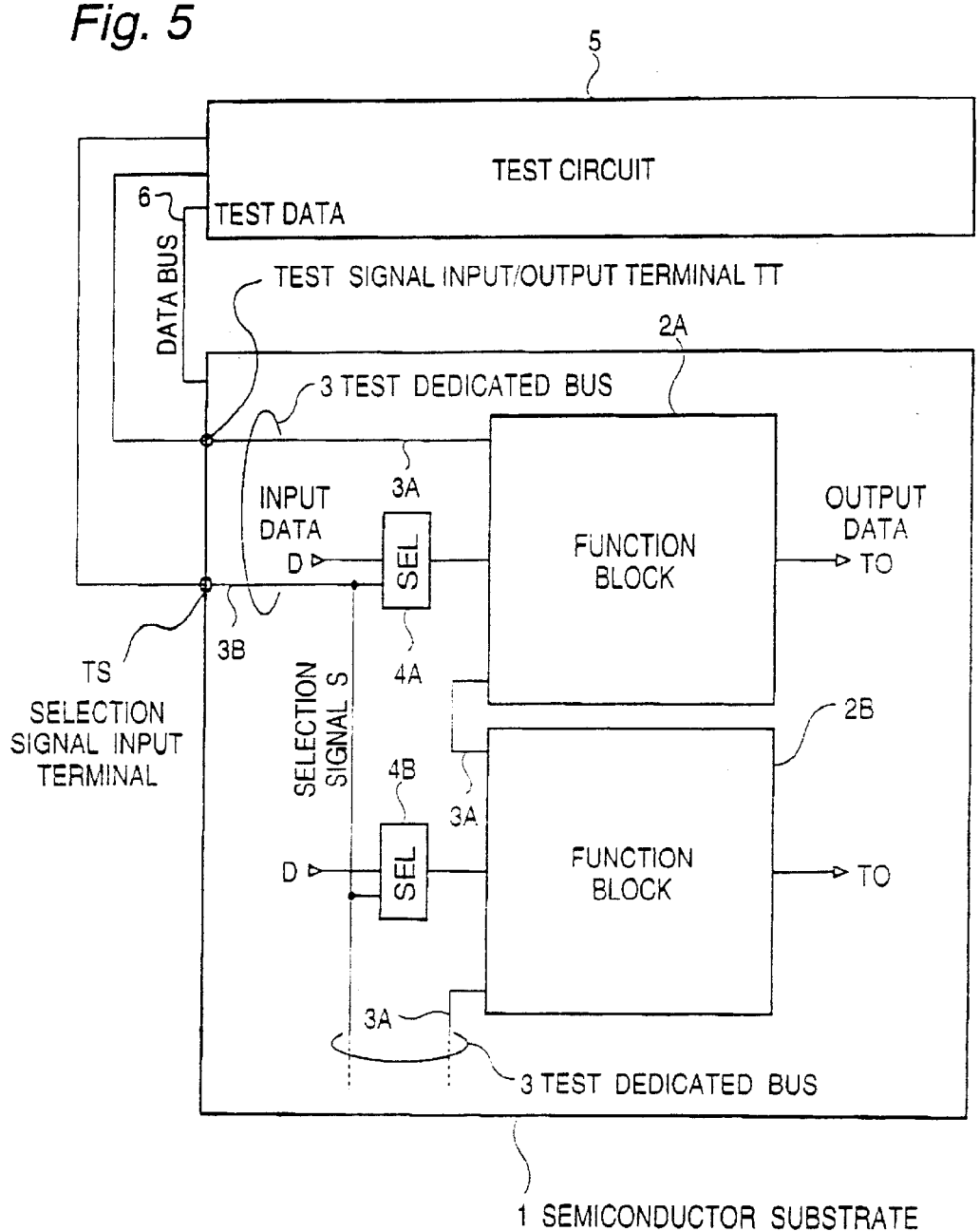
FIG. 5 is a layout diagram illustrating a detail of a portion of the embodiment of the semiconductor integrated circuit device in accordance with the present invention.

Referring to FIG. 5, only two function blocks 2A and 2B are shown for convenience of description, although a number of function blocks 2 actually exist on the semiconductor substrate 1. The semiconductor substrate 1 also includes the test dedicated bus 3 passing through all of the function blocks including the function blocks 2A and 2B, an input/output terminal TT and a selection signal terminal TS connected to the test dedicated bus 3, and selection circuits 4A and 4B each provided for a corresponding one of the function blocks 2A and 2B.

Here, although each of the input/output terminal TT and the selection signal terminal TS, and each of lines 3A and 3B of the test dedicated bus 3 connected to the input/output terminal TT and the selection signal terminal TS, respectively, are shown as a single line for convenience of the drawing, each of the input/output terminal TT and the selection signal terminal TS are composed of a plurality of lines.

The selection signal line 3B is connected to each of the selection circuit 4A and 4B, so that a selection signal S is supplied to all the selection circuit 4A and 4B. This selection signal S includes information for switching the function blocks between a normal operation include and a test mode and information for selecting one of the function blocks for testing. On the other hand the test signal input/output line 2A passes through all of the function blocks including the function blocks 2A and 2B, so as to supply a test pattern to the selected function block and to transfer the result of the testing outputted from the selected function block.

Furthermore, data input lines used in the normal operation mode are inputted to the selection circuits 4A and 4B, respectively. In the normal operation mode, each selection circuit supplies a data input D on the data input line to the associated function block without modification. On the other hand, in the test mode only the selected selection circuit allows the passage of the data input D, and all the non-selected selection circuits block the passage of the data input D on the data input line In addition, each function block has a data output line TO used in the normal operation mode.

In order to individually test the function blocks 2, it is necessary to select the function block to be put under test. For this purpose, the selection signal S is supplied from an external test circuit 5 through the selection signal terminal TS to each of the selection circuits 4A and 4B. For example, assuming that the function block 2A is to be put under test, the selection circuit 4A associated to the function block 2A is put in a set condition so that an input data signal D in the normal mode is supplied from the external test circuit 5 through a data bus 6 and through the selection circuit 4A to the function block 2A, and the selection circuit 4B associated to the other function block 2B is not put in a set condition so that the input data signal D supplied through the data bus 6 is blocked by the selection circuit 4B. Namely, the data signal is not supplied to the function block 2B, and therefore, the function block 2B is not tested.

Furthermore, the test signal is supplied from the external test circuit 5 through the test signal input/output terminal TT to the function block 2A so that the function block 2A is set into a circuit condition to be tested. Thus, the input data signal D is processed by the selected function block 2A, and the result of the processing, namely, the result of the testing is outputted from the function block 2A through test signal input/output lines 3A of the test dedicated bus 3 and through the test signal input/output terminal TT to the external test circuit 5. In this case, the result of the testing can be outputted from the data output TO of the function block through the data bus 6 to the external test circuit 5.

In this manner, all the function blocks 2 are sequentially tested one by one in the order of for example the function block 2A, the function block 2B, ...

When the function blocks are not tested, namely, in the normal operation mode, all the selection circuits 4A, 4B, ... are put in the condition allowing passage of the input data signals D to the corresponding function blocks, so that each function block outputs on the output terminal TO an output signal which is obtained by the function of the function block from the input signal D. Here, the circuit can be so designed that the selection circuits 4A, 4B, ... are put in condition allowing passage of the input data signals D, for example, by grounding the selection signal input terminal TS. Alternatively, the circuit can be so designed that regardless of the condition of the selection signal S, the selection circuits 4A, 4B, ... are put in the condition allowing passage of the input data signals D by another external signal.

The circuit design performed in the step S4 for each function block, can be an existing circuit designing method. Any design is permitted if it is possible to test an internal circuit of the function block. In addition, the design of the circuitry used for the testing can be different from one function block to another.

The test pattern preparation performed in the step S5 is performed independently for each function block.

In the chip fabrication of the step S6, a layout is performed, a mask is prepared and the chip is actually fabricated.

In the chip testing of the step S7, the test is carried out for each function block from one function block to another. The test for the whole of the integrated circuit chip is carried out by supplying a test pattern to input/output pins of the chip and by observing an output of the integrated circuit chip. Here, since the test method for the respective function blocks can be made different from one function block to another, it is possible to select the test method having the highest failure detection percentage for each function block.

In this embodiment, the size of the function block is determined by dividing the chip in accordance with the Rent rule. However, the rule for dividing the chip is not limited only to the Rent rule, but can be freely selected, for example if it is possible to determine the size of the testable function block from the width of the test dedicated bus (namely, the number of lines included in the test dedicated bus).

As a specific example, a large scale LSI can be imagined by considering a current scale logic LSI as each of function blocks obtained by dividing the semiconductor chip. In this case, since each of function blocks has the same number of input/output pins, it is possible to test each of function blocks by connecting the input/output pins to tile test dedicated bus.

In addition, the layout method of the test dedicated bus is also arbitrary, if the test dedicated bus passes through each of all the function blocks with no exception, because it is necessary to guarantee that all the function blocks can be tested. In this connection, it is preferable that the test dedicated bus is as short as possible, since the wasteful chip area becomes necessary if the test dedicated bus is uselessly laid out.

As mentioned above, in this embodiment of the semiconductor integrated circuit device in accordance with the present invention, function elements (logic gate, latch, etc.) formed on the semiconductor substrate can be surely tested by use of the test dedicated bus, in units of one function block. In other words, considering all functions of the semiconductor integrated circuit device as a set of a number of partial functions, and by adding a test circuit in common to all the function blocks, the semiconductor integrated circuit device can be tested and verified effectively and economically with a small amount of additional circuit and a small number of additional input/output terminals.

In addition it is guaranteed that all the function blocks thus prepared have an equal size over the whole of the chip, and also have the size capable of realizing the most effective testing. It is also guaranteed that the whole of the chip can be tested.

As mentioned hereinbefore, in general, the larger the circuit scale is, the required test time exponentially increases, and on the other hand, the precision of test exponentially decreases. Therefore, the division of the region to be tested into a suitable size, is very effective in shortening the test time and in elevating the precision of the test. This can be easily realized by the above mentioned arrangement in accordance with the present invention.

Figure 6:
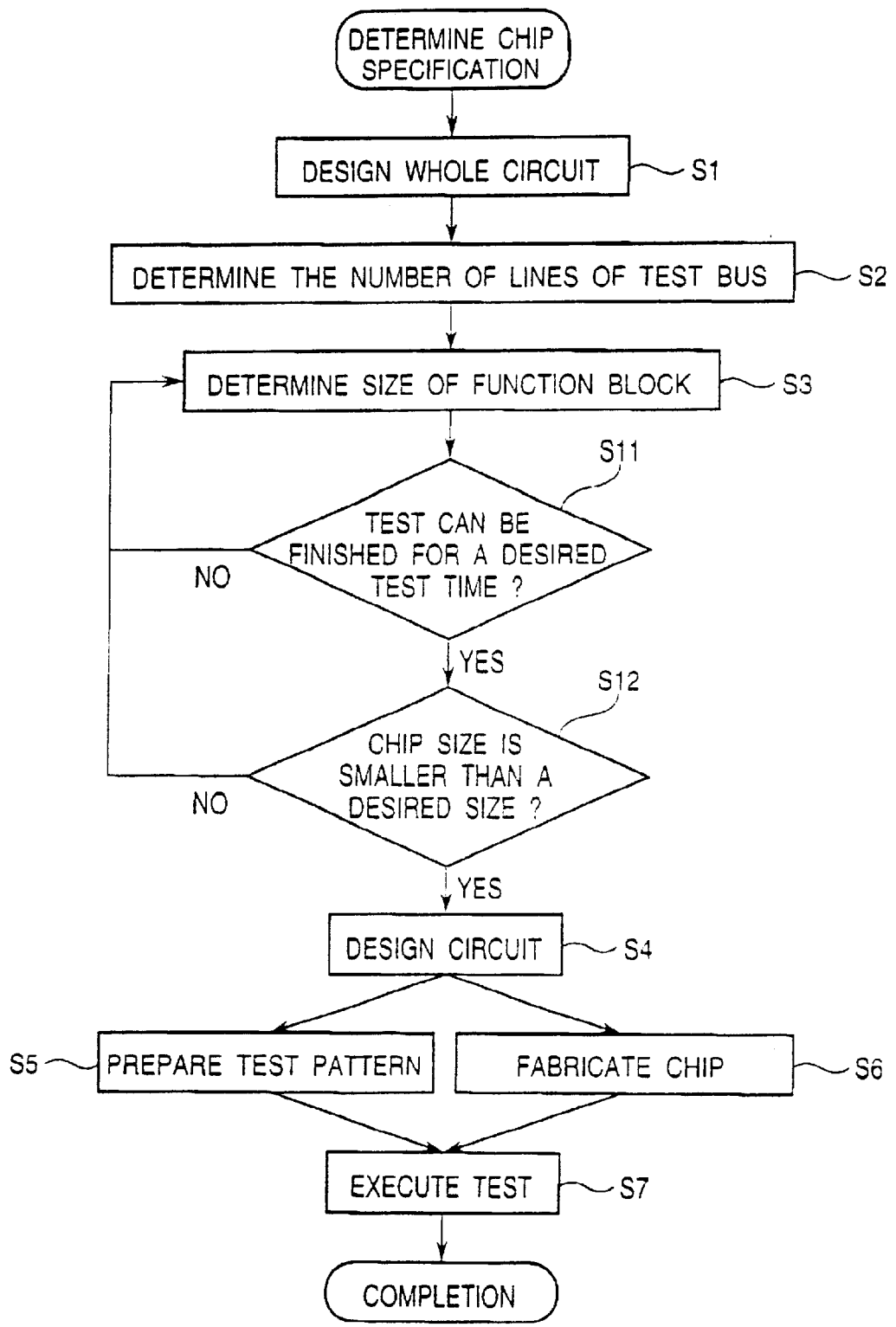
FIG. 6 is a flow chart for illustrating the steps of another embodiment of the circuit designing method in accordance with the present invention.

Referring to FIG. 6, there is shown a flow chart for illustrating the steps of another embodiment of the circuit designing method in accordance with the present invention. This second embodiment of the circuit designing method is characterized in that condition discrimination steps S11 and S12 for the test time and the chip size are inserted between the function block size determination step S3 and the circuit design step S4 in the first embodiment of the circuit designing method.

Therefore, this second embodiment of the circuit designing method is carried out similarly to the first embodiment of the circuit designing method, until the step S3. Namely, the size of the function block is determined in accordance with the number of lines included in the test dedicated bus, and the semiconductor chip is divided into a plurality of function blocks each having the block size thus determined. In this condition, a test time is estimated (step S11). If the estimated test time is too long, the operation returns to the step S3. If the estimated test time does not exceed a desired test time, the size of the whole of the chip is estimated, and whether or not the estimated size of the whole of the chip is smaller than a desired size, is examined (Step S12). If the estimated size of the whole of the chip is smaller than a desired size, the operation goes to the step S4. If the estimated size of the whole of the chip is not smaller than a desired size, the operation returns to the step S3.

If the operation returns to the step S3, the size of the function block is determined by changing the dividing method so that the size of the function block becomes different, or alternately, the size of the function block is simply and directly changed in the same dividing method.

This second embodiment is more advantageous than the first embodiment, since it is possible to shorten the actual test time and to reduce the test cost.

As mentioned above, in the semiconductor integrated circuit device and the circuit designing method therefor in accordance with the present invention, the whole of a logic LSI formed on a semiconductor substrate is divided in accordance with a predetermined dividing rule into the plurality of function blocks which have a constant size and which are located in a predetermined locating manner, and a test dedicated bus is laid out on the semiconductor substrate to pass through all the plurality of function blocks for transferring the test data and the test result of each function block. Therefore, each of the function blocks can be tested through the test dedicated bus independently of the other function blocks. Accordingly, the semiconductor integrated circuit device can be tested and verified effectively and economically with a small amount of additional circuit and a small number of additional input/output terminals.

In addition, since all the function blocks thus prepared have an equal size over the whole of the chip the most effective testing can be realized, and the whole of the chip can be tested Furthermore, it is possible to shorten the test time and to elevate the precision of the test by dividing a region to be tested, into a suitable size.

The invention has thus been shown and described with reference to the specific embodiments. However, it should be noted that the present invention is in no way limited to the details of the illustrated structures but changes and modifications may be made within the scope of the appended claims.

What is claimed:

1. A semiconductor integrated circuit device including a logic LSI formed on a semiconductor substrate and divided into a plurality of function blocks, each of which can receive a test data directly from an external device and can output a test result directly to the external device, wherein the whole of said logic LSI is divided in accordance with a predetermined dividing rule into said plurality of function blocks which have a constant size and which are located in a predetermined locating manner, and a test dedicated bus is laid out on said semiconductor substrate to pass through all said plurality of function blocks for transferring the test data and the test result of each function block.

2. A semiconductor integrated circuit device claimed in claim 1 wherein said predetermined dividing rule is:

$$P = K \times G^\gamma$$

where G is the in-block gate number;

P is the input/output pin number per one block;

K is a constant number which is in the range of 2.5 to 5.0, and

γ is a constant number which is in the range of 0.4 to 0.7.

3. A semiconductor integrated circuit device claimed in claim 1 wherein said plurality of function blocks is located in the form of a matrix, and said test dedicated bus is laid out, just as a single stroke painting, to pass through all said plurality of function blocks located in the form of the matrix.

4. A semiconductor integrated circuit device claimed in claim 1 wherein said logic LSI further includes a selection signal terminal for receiving a selection signal for selecting one of said function block for the testing, a test signal input/output terminal for receiving a test signal used for the testing of the function block and connected to said test dedicated bus, and plurality of selection circuits each provided for a corresponding one of said function block and receiving said selection signal from said selection signal terminal for switching said corresponding function block between a normal operation mode and a test mode.

5. A circuit designing method for a semiconductor integrated circuit device, comprising:

designing a whole circuit, including a plurality of circuit designs corresponding to predetermined functions, respectively and a design for a test circuit for testing said predetermined functions;

determining a width of a test dedicated bus for transferring a test pattern to be supplied to said test circuit and the result of a test from said test circuit;

determining a function block size which is a size of function blocks obtained by dividing the whole circuit in accordance with a predetermined dividing rule;

designing a circuit for each function block in consideration of said width of said test dedicated bus, so that said whole circuit includes a plurality of function blocks each having the determined function block size;

preparing said test pattern for each of said function blocks; and fabricating a semiconductor chip on the basis of the design result in said circuit designing step.

6. A circuit designing method claimed in claim 5 further including between said function block size determining step and said circuit designing step, a test time condition discriminating step for discriminating whether or not a required test time is within a desired time, and a chip size condition discriminating step for discriminating whether or not a chip size is within a desired size.

7. The method as recited in claim 5, further comprising:

testing said semiconductor chip thus fabricated, by using said test pattern prepared in said test pattern preparing step.

8. A semiconductor integrated circuit device comprising:

a circuit disposed on a semiconductor substrate and divided into a plurality of function blocks based on an area dividing rule, each function block effective to receive input test data and output result test data; and a test bus disposed so that the test bus is coupled to each of the function blocks, the test bus effective to transfer the input test data to each function block and to receive the output result test data from each function block.

9. The semiconductor integrated circuit device as recited in claim 8, further comprising:

at least one selection circuit coupled to a respective function block and further coupled to the test bus; wherein each selection circuit selectively controls the function block to receive test signals from the test bus.

10. The semiconductor integrated circuit device as recited in claim 9, wherein the substrate includes a test signal terminal coupled to the respective function block and to the test bus, the test signal terminal conveying the test signal to the function block when the selection circuit controls the function block to receive the test signal.

11. The semiconductor integrated circuit device as recited in claim 8, wherein the circuit is divided into the plurality of function blocks using Rent's Rule.

12. The semiconductor integrated circuit device as recited in claim 8, wherein the function blocks are disposed on the substrate in a matrix format.

* * * * *